(12) United States Patent
Davidovici

(10) Patent No.: US 8,853,611 B2
(45) Date of Patent: Oct. 7, 2014

(54) SYSTEM AND METHOD FOR A HIGH DYNAMIC RANGE SENSITIVE SENSOR ELEMENT OR ARRAY

(71) Applicant: Sorin Davidovici, Oceanport, NJ (US)

(72) Inventor: Sorin Davidovici, Oceanport, NJ (US)

(73) Assignee: RJS Technology, Inc., Hollis, NH (US)

( * ) Notice: Subject to any disclaimer, the term of this patent is extended or adjusted under 35 U.S.C. 154(b) by 0 days.

(21) Appl. No.: 13/782,025

(22) Filed: Mar. 1, 2013

(65) Prior Publication Data

US 2013/0175436 A1   Jul. 11, 2013

Related U.S. Application Data

(63) Continuation-in-part of application No. 12/852,459, filed on Aug. 7, 2010, now Pat. No. 8,735,793.

(51) Int. Cl.
| | |
|---|---|
| H01L 27/00 | (2006.01) |
| H04N 5/235 | (2006.01) |
| H04N 5/378 | (2011.01) |
| H04N 5/355 | (2011.01) |
| H03M 1/64 | (2006.01) |
| H04N 5/243 | (2006.01) |
| H04N 3/14 | (2006.01) |
| G01J 1/44 | (2006.01) |

(52) U.S. Cl.
CPC ............. *H04N 5/378* (2013.01); *H04N 5/2351* (2013.01); *H04N 5/235* (2013.01); *H04N 5/355* (2013.01); *H03M 1/64* (2013.01); *G01J 1/44* (2013.01); *H04N 5/243* (2013.01); *H04N 5/35527* (2013.01); *H04N 3/155* (2013.01)
USPC ...................... 250/208.1; 348/639; 341/157

(58) Field of Classification Search
USPC ......... 250/208.1; 348/441, 506, 639; 341/157
See application file for complete search history.

(56) References Cited

U.S. PATENT DOCUMENTS

| | | | | |
|---|---|---|---|---|
| 2002/0033714 | A1* | 3/2002 | Perrott | 327/12 |
| 2002/0146067 | A1* | 10/2002 | Brassil et al. | 375/219 |
| 2002/0176009 | A1* | 11/2002 | Johnson et al. | 348/229 |
| 2003/0150977 | A1* | 8/2003 | Yamazaki et al. | 250/214.1 |
| 2003/0184673 | A1* | 10/2003 | Skow | 348/364 |
| 2005/0046719 | A1* | 3/2005 | Inui | 348/308 |
| 2005/0185064 | A1* | 8/2005 | Ogawa | 348/222.1 |

* cited by examiner

*Primary Examiner* — Seung C Sohn
(74) *Attorney, Agent, or Firm* — Lindsay G. McGuinness

(57) ABSTRACT

A high dynamic range sensitive sensor element or array is provided which uses periodic sampling phase domain integration techniques to accurately capture high and low intensity images. The sensor element of the present invention is not limited by dynamic range characteristics exhibited by prior art solid-state pixel structures and is thus capable of capturing a full spectrum of electromagnetic radiation to provide a high quality output image.

16 Claims, 18 Drawing Sheets

Figure 11A
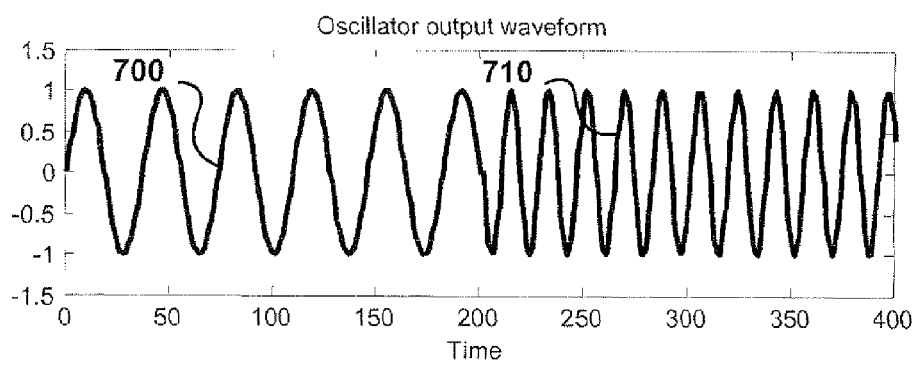
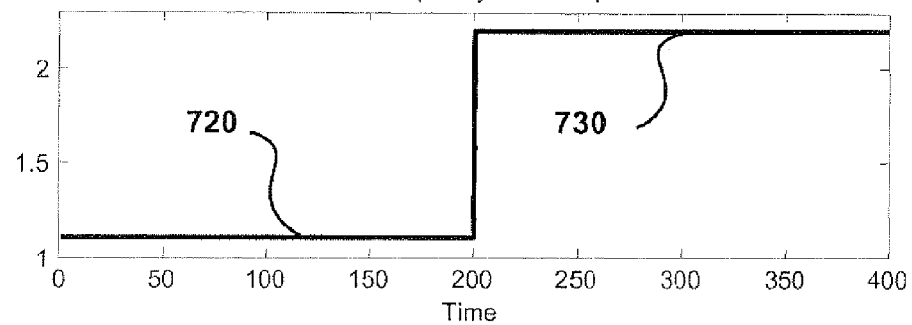
Figure 11B

Figure 13E
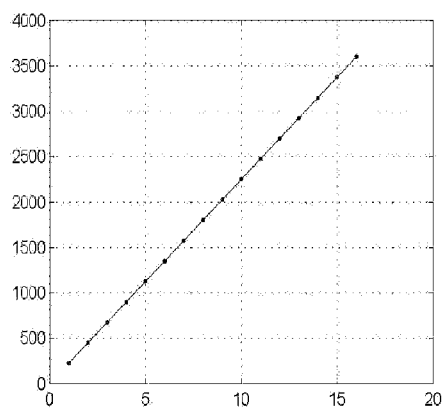
Figure 13F
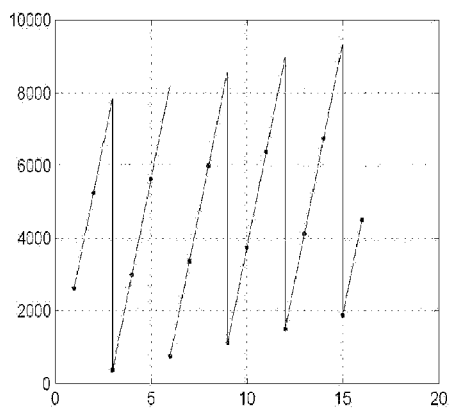
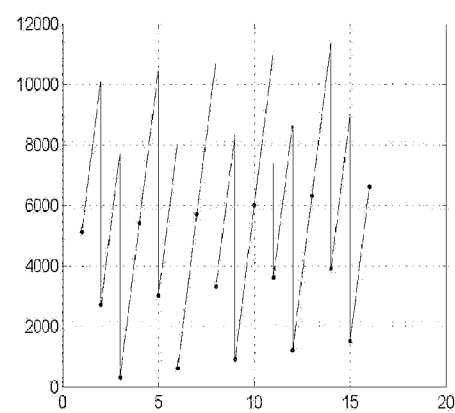
Figure 13G
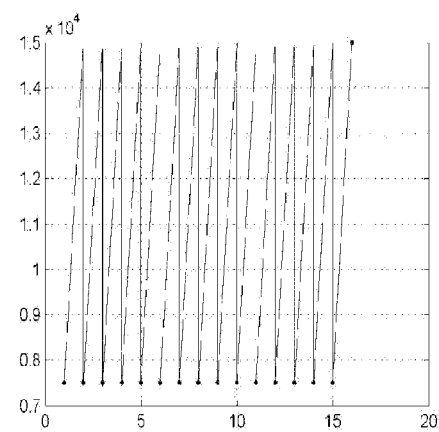
Figure 13H

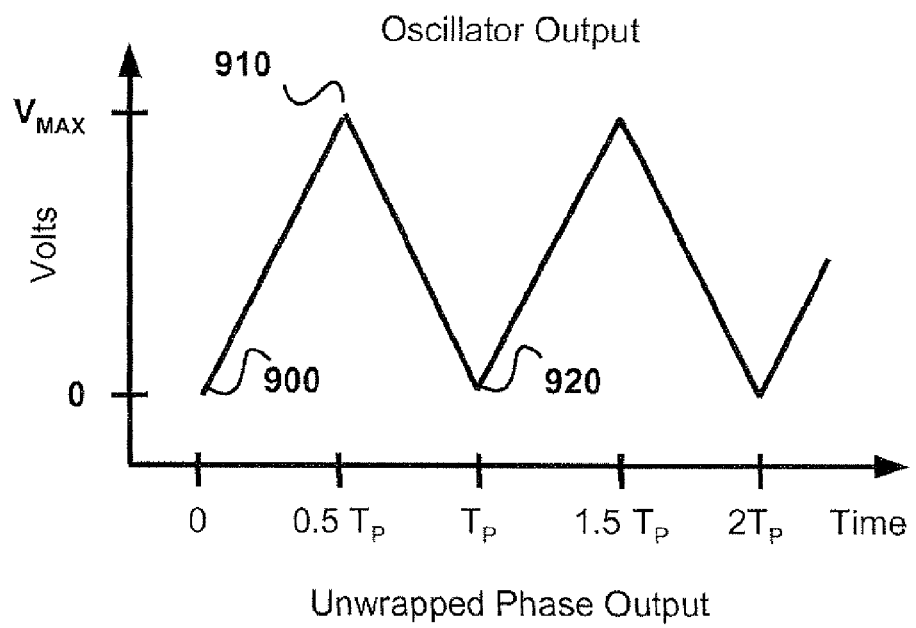
Oscillator Output
Unwrapped Phase Output
Figure 14A
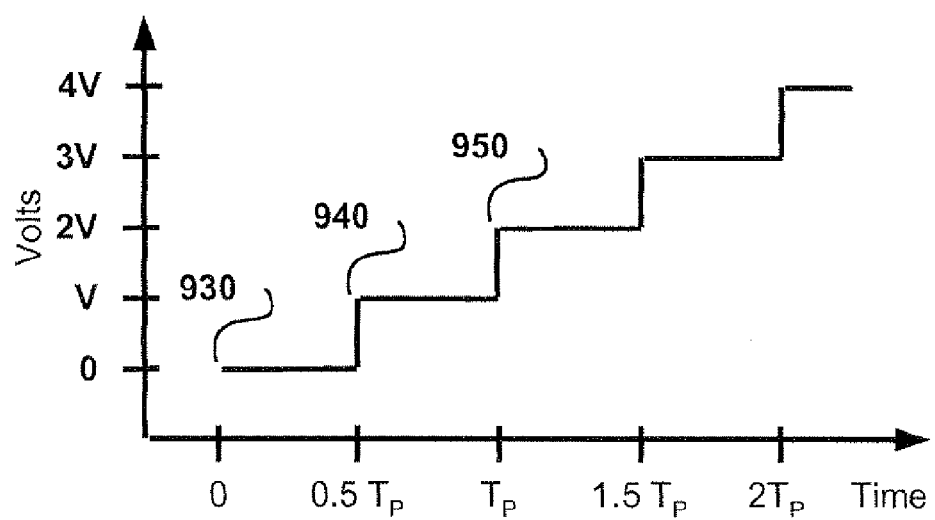
Figure 14B Phase unwrapping

SYSTEM AND METHOD FOR A HIGH DYNAMIC RANGE SENSITIVE SENSOR ELEMENT OR ARRAY

CROSS REFERENCE TO RELATED APPLICATIONS

This application is a continuation in part and claims priority under 35 U.S.C. 120 to U.S. patent application Ser. No. 12/852,459, filed Aug. 7, 2010, which is a continuation of U.S. Pat. No. 7,786,422 filed Sep. 21, 2006, which claims priority under 35 U.S.C. §1.119(e) to provisional patent application Nos. 60/719,306, 60/719,304 and 60/719, filed on Sep. 21, 2005 by Davidovici et al, and to provisional patent application Ser. No. 60/727,897 filed Oct. 18, 2005 by Davidovici et al. All of the above identified priority applications are incorporated herein by reference.

FIELD OF THE INVENTION

This invention relates generally to the field of electronic imaging and more particularly to a method and apparatus for enhanced image capture using photometric measurement and reporting.

BACKGROUND OF THE INVENTION

Photography is the process of making pictures by means of the action of light. Light is the commonly used term for electromagnetic radiation in a frequency range that is visible to the human eye. Light patterns reflected or emitted from objects are recorded by an image sensor through a timed exposure. Image sensors can be chemical in nature, such as photographic film, or solid state in nature, such as the CCD and CMOS image sensors employed by digital still and video cameras.

Digital cameras have a series of lenses that focus light to create an image of a scene. But instead of focusing this light onto a piece of film, as in traditional cameras, it focuses it onto the image sensor which converts the electromagnetic radiation of the light into an electrical charge. The image sensor is said to be a picture element, or a 'pixel.' The electrical charge indicates a relative intensity of the electromagnetic radiation as perceived by the image sensor, and generally is used to associate a light intensity value with the pixel.

FIG. 1 illustrates typical component blocks that may be included in a digital image processing system 10. The system 10 includes a signal source 100 and a signal processing chain that consists of integrator 110, analog to digital converter (ADC) 120 and DSP 130. Signal source 100 could for example be a sensor such as a light intensity sensor that generates an electrical response in response to electromagnetic radiation, such as light, impinging upon it.

The output of integrator 110, $V_{OUT}$, is input to ADC 120. ADC 120 performs the analog to digital conversion function. The analog to digital conversion function is well known in the art. The analog signal $V_{OUT}$ present at ADC 120 input is converted into signal $V_D$ that can take one of a set of discrete levels.

The quality of the signal is improved by integrator 110 which integrates the signal $V_{IN}$. FIG. 2 illustrates the nature of the signal improvement. Waveform 200 is the combination of a constant value signal generated by signal source 100 and additive noise that corrupts the constant value signal. Waveform 210 is the integrator output generated in response to input signal waveform 200. It is readily observed that signal fluctuations caused by the additive noise decrease in waveform 210.

Signal source 100 could be a light intensity sensor that is used in a timed application, such as in a digital camera application where the sensor is exposed to the light for a specific duration of time, commonly referred to as the exposure time. The integrator 110 then also serves the function of integrating the response of sensor 100 caused by all photons received during the exposure time into one value, such as for example a voltage, to be read-out at the end of the exposure time.

FIG. 3 illustrates a typical image sensor circuit. Signal source 1000 is a light sensor that by way of example can be said to be a photodiode. Capacitor 1040 is a simple integrator. The input to the integrator is the output of signal source 1000. Capacitor 1040 is reset by switch 1050 which is in the closed position prior to starting the integration process. At the start of the integration process switch 1050 opens and the voltage across capacitor 1040 begins to change in response to the input signal originating from signal source 1000. At the end of the integration process switch 1030 closes and integrator output 1060, $V_{OUT}$, is sampled. FIG. 3 is an illustrative diagram. The implementation of other similar integrators with identical functionality is well known to one skilled in the art.

Integrator output 1060, $V_{OUT}$, cannot in general exceed the upper limit imposed by the available power supply voltage. Power supply voltages are decreasing in state-of-the-art equipment due to stringent power consumption requirements. Integrator output 1060 cannot exceed the power supply voltage and will saturate if the integrator output signal continues to build after reaching the power supply voltage level. The saturation condition is illustrated in FIG. 4A. Saturation occurs when the output voltage reaches the available power supply voltage and is unable to increase any further in response to the input signal. Signal saturation causes system performance degradation. FIGS. 4A through 4C illustrate potential distortions at the output of a pixel structure consisting of light sensor 100 and integrator 110 due to the dynamic range limitation of the photosensitive element structure and more specifically of the integrator structure.

Segment (a) of FIG. 4A illustrates the linear increase of integrator 110 output in response to a constant input signal of different level. The image sensor structure will perform well for the range of input light intensities that give rise to the linear output of segment (a); the image sensor structure will not perform well for the range of input light intensities that give rise to the saturated output of segment (b).

The integrator output response is indicative of limited dynamic range. As illustrated in FIG. 4A the image sensor will render well shadow detail but will fail to render highlight detail. It is possible to shift the response as illustrated FIGS. 4B and 4C. In FIGS. 4B and 4C the dynamic range of the image sensor remains the same but the response characteristic is shifted. The response characteristic of FIG. 4B loses shadow and highlight detail but retains good midrange response. The response characteristic of FIG. 4C loses shadow detail and partial midrange detail in order to maintain good highlight detail.

FIG. 5A illustrates the histogram of the pixel intensities of an overexposed image capture where a multitude of pixels were driven into saturation, such as in FIG. 4A. As seen in FIG. 5A the maximum pixel structure output value is '255' and the units used are the ADC 120 output codes corresponding to the pixel output voltage. The light intensity caused many light sensors 100 to output a value that saturated the integrator 110 as the exposure progressed during the exposure period. The maximum (saturated) value of the integrator 110 output caused the ADC to generate the output code '255' which is the maximum output code for an 8-bit ADC. The image capture will be of suboptimal quality due to the inability of those pixels subject to high intensity light inputs to achieve a sufficiently high output level. A lower integrator 110 gain would have caused the outputs of the light image sensor subject to high intensity light inputs to register a below-255 output and avoid the high end distortion.

FIG. 5B illustrates the histogram of the pixel intensities of an underexposed image capture where a multitude of pixels were not exposed to sufficient light to achieve a minimum output value. As seen in FIG. 5B the minimum pixel structure output value is '0' and the units used are the ADC 120 output codes corresponding to the pixel output voltage. The light intensity caused many light sensors 100 to output a value that failed to cause integrator 110 to output a sufficiently high value to cause a minimal ADC output code as the exposure progressed during the exposure period.

The image capture will be of suboptimal quality due to the inability of those pixels subject to low intensity light inputs to achieve a sufficiently high output level. The distortion illustrated in the histogram of FIG. 5B corresponds to the individual pixel distortion of FIG. 4C. A higher integrator 110 gain would have caused the outputs of the light image sensor, subject to low intensity light inputs, to register an above-zero output and avoid the low end distortion.

FIG. 6 illustrates the response curve of a pixel structure built using double-slope technology. The nonlinear extension of dynamic range illustrated in FIG. 6 avoids saturation effects; however, the non-linear relationship between the intensity of the electromagnetic energy impinging upon the sensor and the sensor's output causes the image to be captured with reduced resolution when high levels of light intensity are present.

Other approaches such as multiple exposure combining, conditional slope switching and logarithmic response pixel structures have been published. The multiple exposure combining, conditional slope switching and logarithmic response pixel structures exhibit performance degradations that render them unsuitable for high performance image acquisition tasks.

Integrator saturation is the limiting factor in the dynamic range performance of a pixel structure. Solutions to the integrator saturation problem have been published. One feature the published solutions have in common is the monitoring of the integrator output to detect the onset of saturation condition at which time the integrator is discharged and the event is recorded. This class of solutions is difficult to implement efficiently in integrated circuits (ICs) due to accuracy requirements of analog components and non-standard analog implementations. The implementation of accurate comparators that operate in a noisy environment near the power supply voltage, where integrator outputs begin to saturate, is a difficult undertaking that consumes excessive power, an undesirable operational feature.

Analog IC designs are difficult and time consuming to implement. It is advantageous to use standard building blocks that have been fully debugged and optimized for size, power consumption and performance. The class of published solutions does not meet this requirement.

SUMMARY OF THE INVENTION

According to one aspect of the invention, a method for obtaining a high dynamic range read-out signal from a pixel structure includes the step of generating an integrated value of a response of a photosensitive element to impinging electromagnetic radiation via one of continuous or periodic sampling of the impinging radiation to generate phase information associated with the response.

According to a further aspect of the invention, a pixel structure includes a photosensitive element for generating a signal in response to electromagnetic radiation and a phase integrator, coupled to the photosensitive element, for integrating the response of the photosensitive element to the electromagnetic radiation over an exposure time period using phase information which has been generated via continuous or periodic sampling of the electronic radiation during the exposure time period.

With such an arrangement, a solid-state pixel is provided that is capable of producing a faithful reproduction of an image to be captured regardless of the intensity of electromagnetic energy impinging on the sensor.

These and other advantages of the invention will be described with regard to the below figures.

BRIEF DESCRIPTION OF THE FIGURES

FIG. 11A is a graph which illustrates an adjustable oscillator waveform that varies in frequency in response to an oscillator input illustrated in FIG. 11B;

FIGS. 13A-13H illustrate several common VCO output waveforms;

FIGS. 14A and 14B are graphs provided to illustrate a phase unwrapping mechanism of the present invention;

DETAILED DESCRIPTION

According to one aspect of the invention, a high dynamic range capable sensor element or array is provided which uses phase domain integration techniques to accurately capture high and low intensity images. The sensor element of the present invention is not limited by dynamic range characteristics exhibited by prior art solid-state pixel structures and is thus capable of capturing a full range of electromagnetic radiation to provide a high quality output image.

Figure 7A:
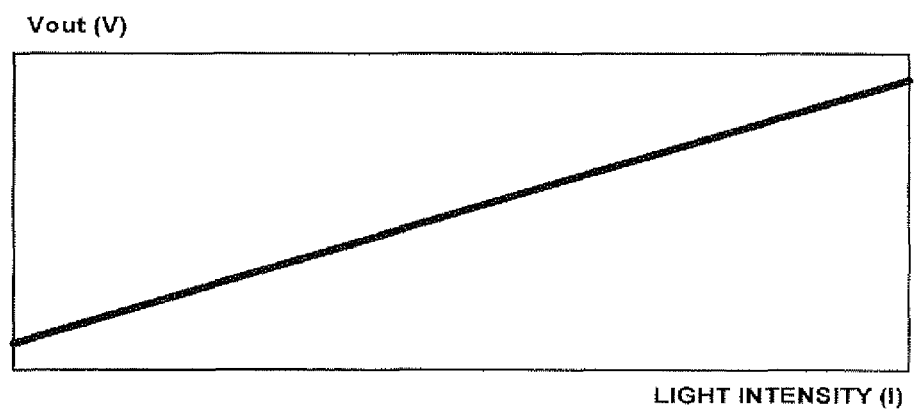
FIG. 7A is a response curve of a pixel structure of the present invention.

FIG. 7A illustrates the response of a sensor element built using the technology of the present invention. The extended dynamic range of the sensor element is sufficient to enable it to respond to impinging radiation with a pixel response over the full range of electromagnetic radiation intensity. As a result the sensor element is able to capture sufficient charges in the darkest portion while avoiding the saturation affects in the brightness portions of the image to be captured. The net effect it is faithful reproduction of the image to be captured regardless of the relative intensity of the electromagnetic energy impinging upon the sensor.

Figure 7B:
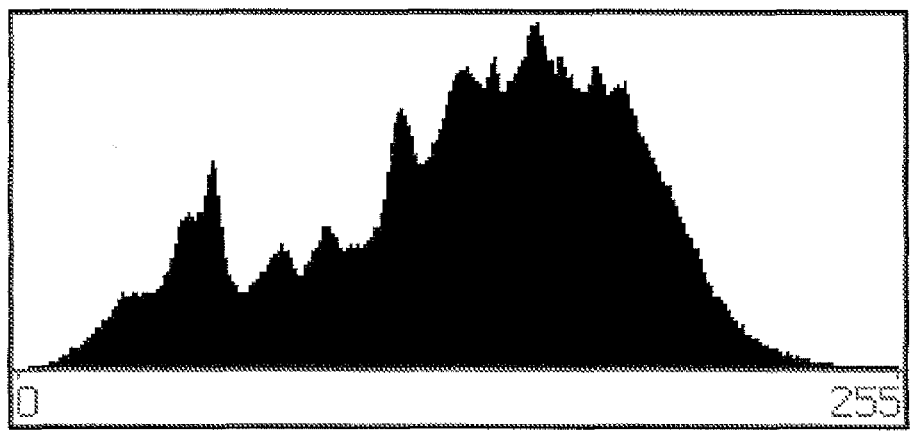
FIG. 7B illustrates an exemplary histogram of pixel intensities in a captured image of the present invention.

FIG. 7B illustrates the histogram of the pixel intensities of a correctly exposed image capture where all pixel outputs are within the dynamic range of the 8-bit ADC that is zero to 255.

The sensor element of the present invention includes a novel integrator implementation that is based on frequency oscillator circuits. Frequency oscillator circuits are standard IC component blocks and do not suffer the disadvantages of the prior art solid-state devices. Also, the novel sensor elements disclosed herein uses accurate integrators that can accommodate output signal values far in excess of available power supply voltages and with very high accuracy and dynamic range.

Figure 1:
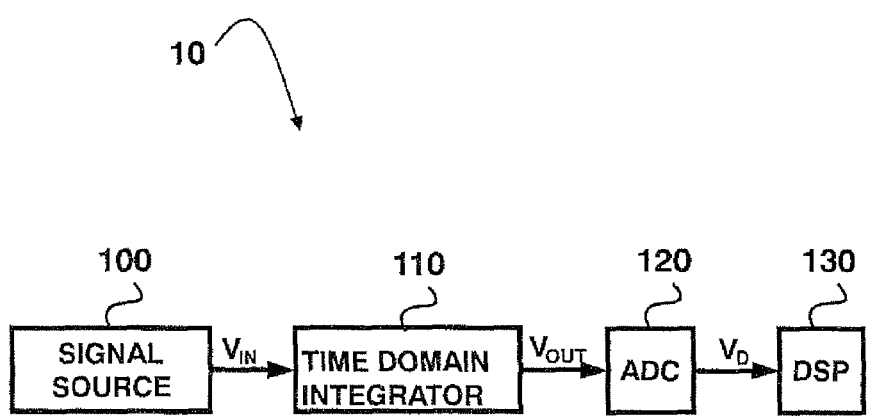
FIG. 1 is a block diagram illustrating exemplary components that may be included in an image acquisition chain.
Figure 2:
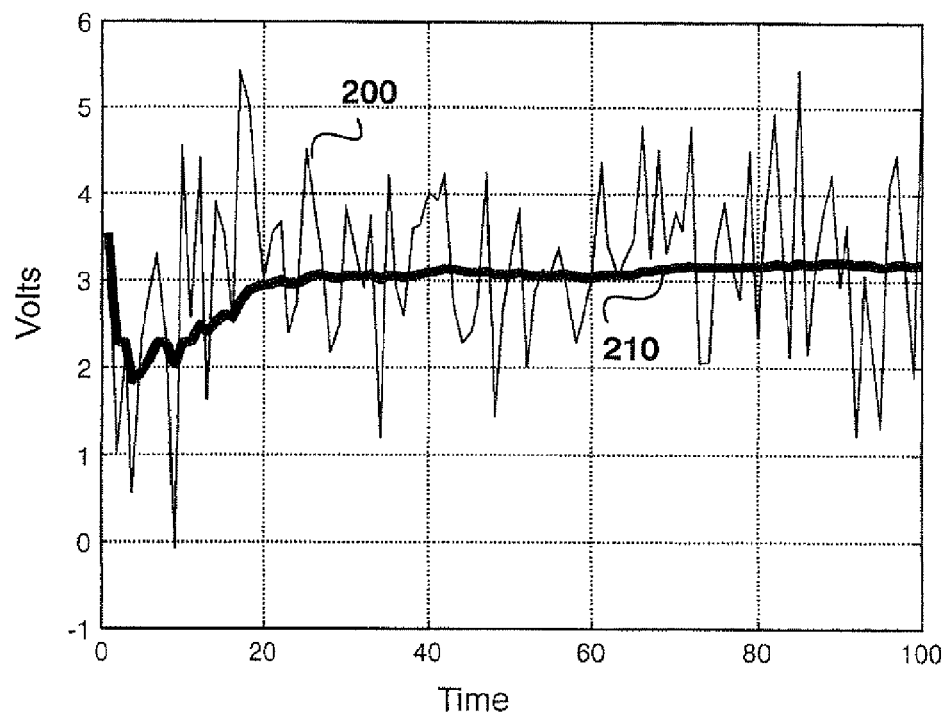
FIG. 2 is a graph illustrating the output of an integrator.
Figure 3:
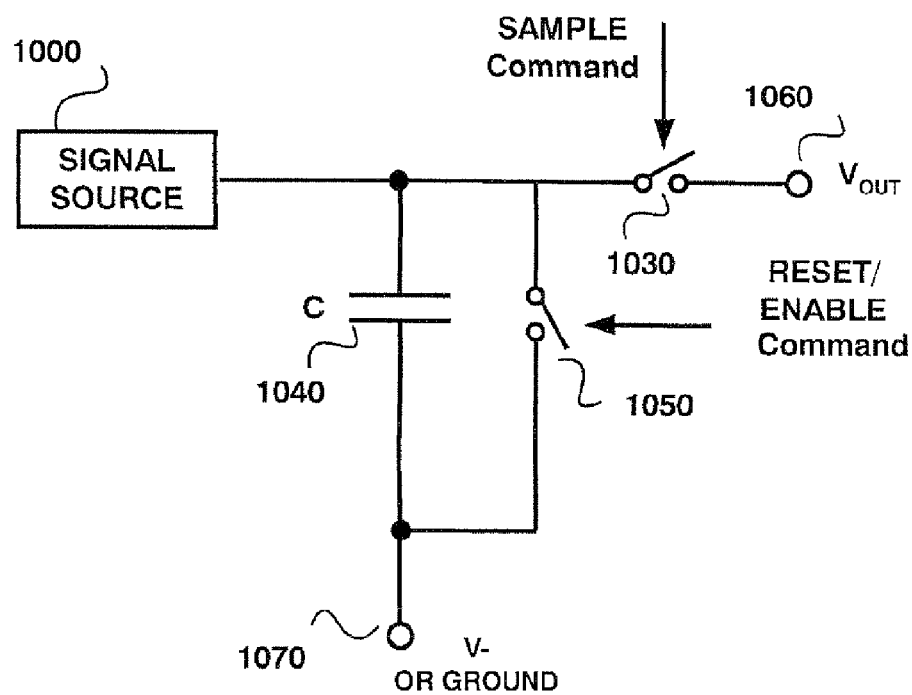
FIG. 3 is a block diagram of a typical pixel structure.
Figure 4A:
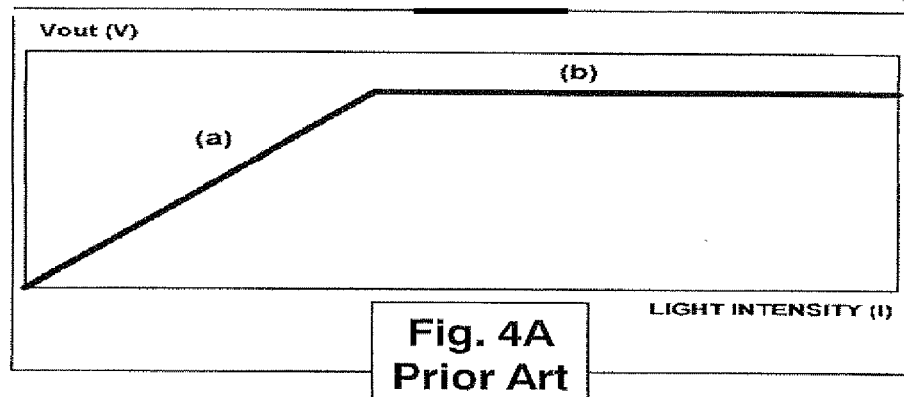
FIGS. 4A-4C are transfer curves provided to describe distortions at the output of a pixel structure such as that of FIG. 3, illustrating the effect of dynamic range limitations.
Figure 4B:
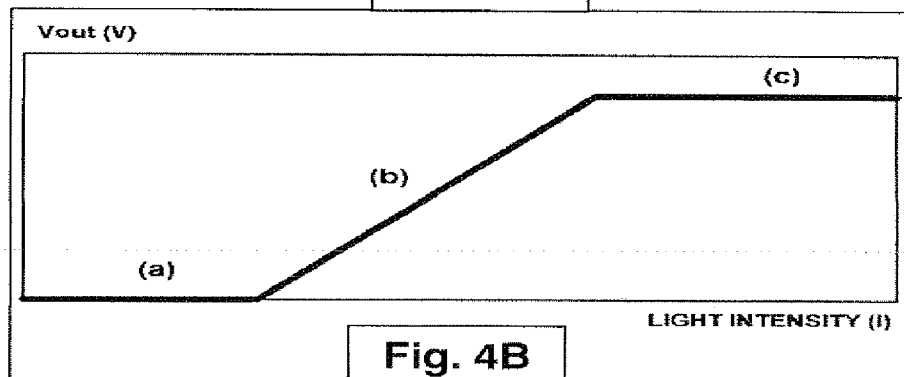
Figure 4C:
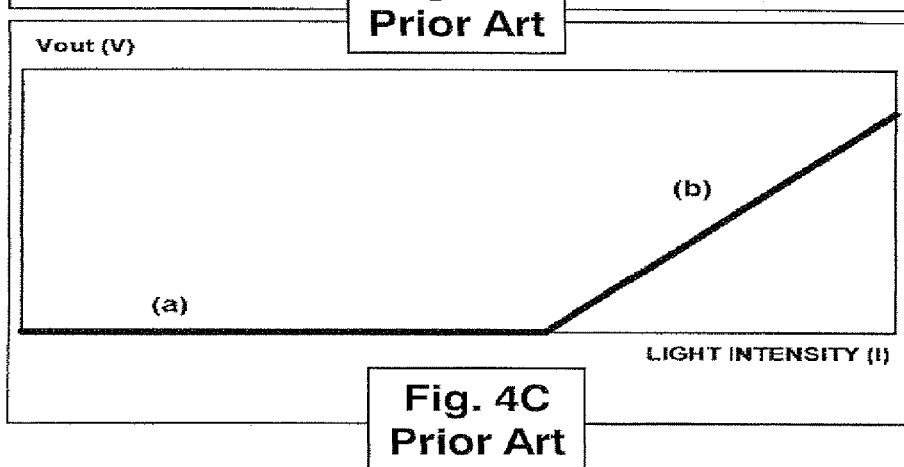
Figure 5A:
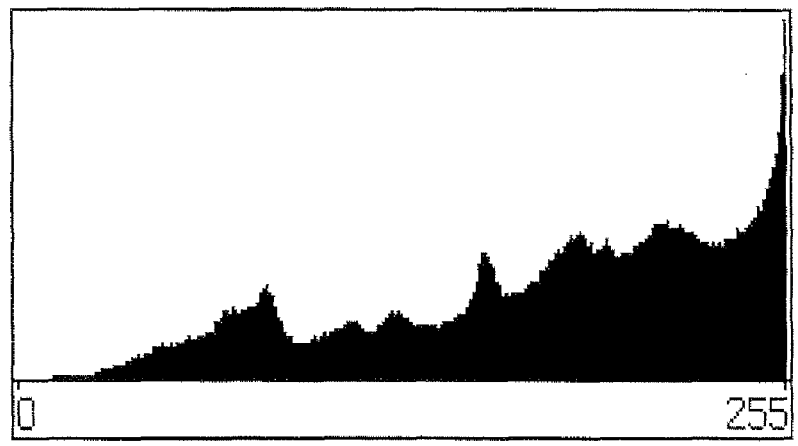
FIGS. 5A and 5B are histograms of pixel intensities of respective overexposed and underexposed image capture.
Figure 5B:
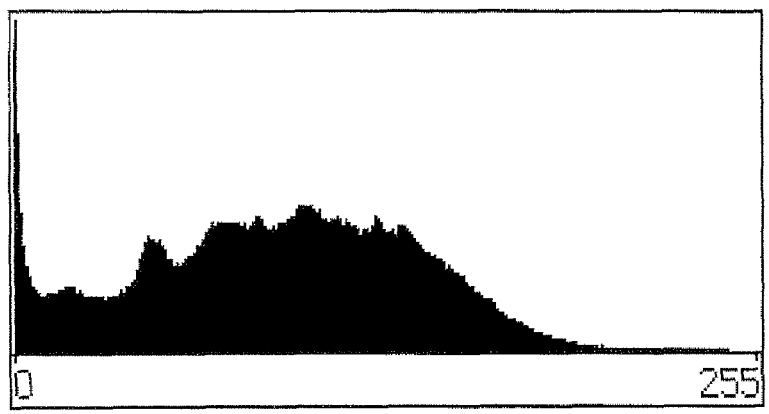
Figure 6:
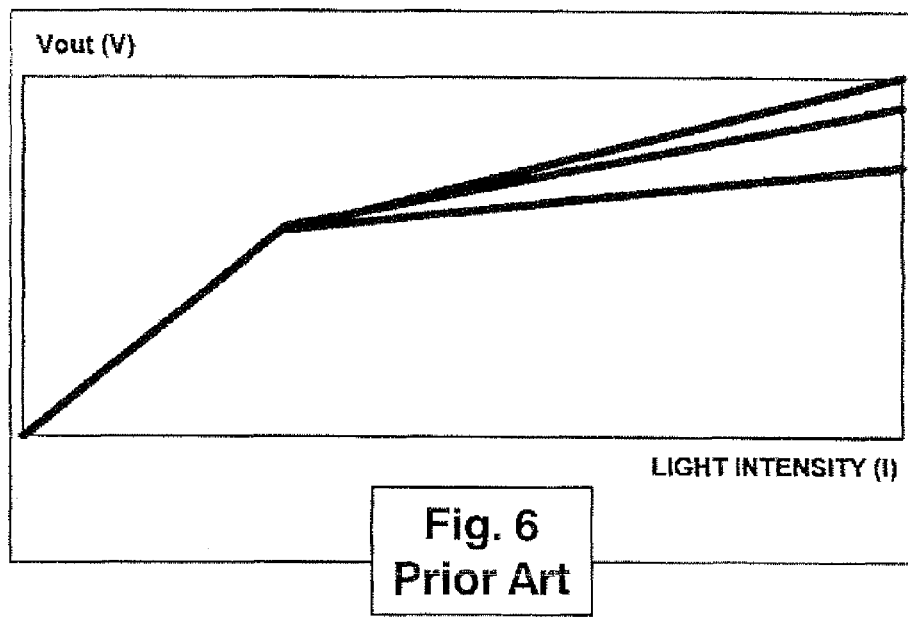
FIG. 6 is a response curve of a pixel structure built using double-slope technology.
Figure 8:
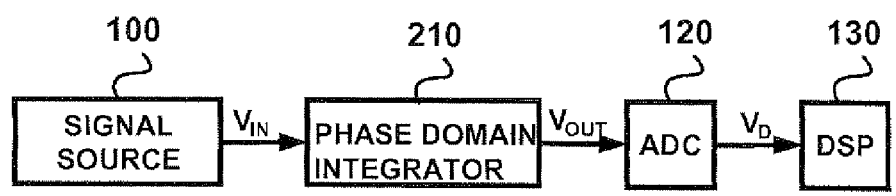
FIG. 8 is a block diagram of a pixel structure of the present invention followed by ADC and DSP blocks.
Figure 9:
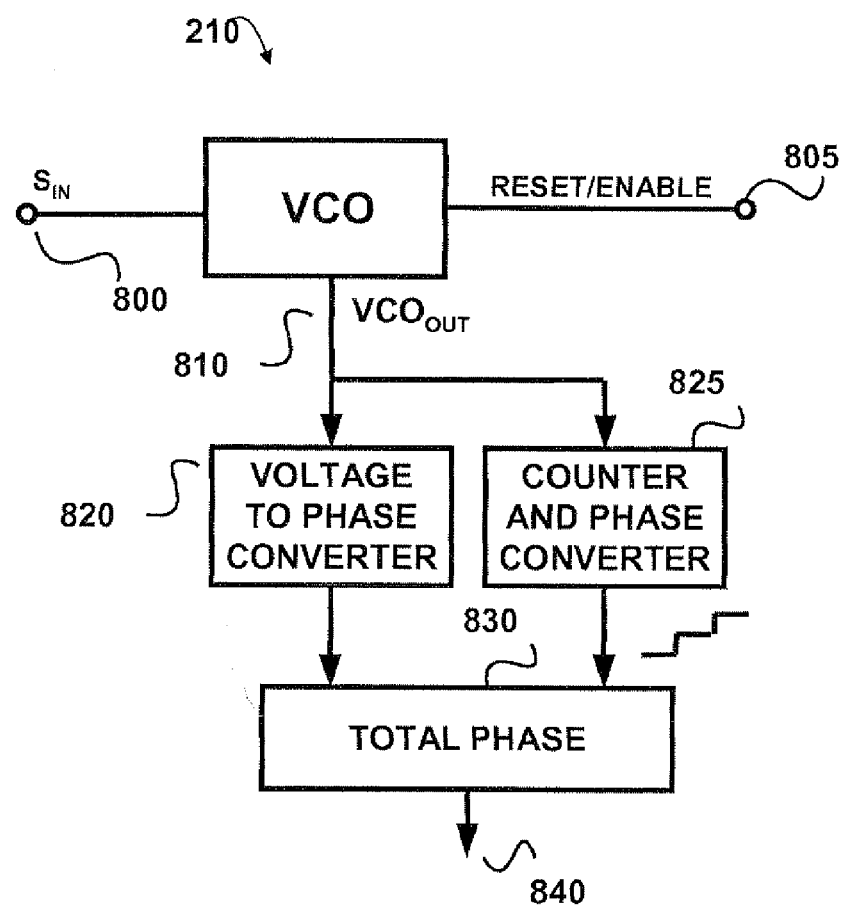
FIG. 9 is a block diagram of one embodiment of a phase domain integrator of the present invention.

For high performance image acquisition it is desirable to have image sensors capable of high resolution and high dynamic range image acquisition using a single sensor read-out step. FIG. 8 illustrates an exemplary pixel structure of the present invention. The pixel structure of FIG. 8 uses the conventional signal acquisition structure of FIG. 3 but replaces the time domain integrator 110 with a novel phase domain integrator 210. FIG. 9 shows the phase domain integrator of the present invention in more detail.

In the present invention, the output of signal source 100 (FIG. 8) is connected to the input 800 of the phase domain integrator of FIG. 9. At the end of the integration period the integral of the input signal is read in phase format at the phase domain integrator output 840. Such an image sensor enables brightness information (represented by total traversed phase) that is proportional to the received photon irradiance to be provided without the need for additional circuitry external to the image sensor itself.

The image sensor assembly and specifically the integrator section satisfy two criteria: a) produce a large output in response to weak input signals from the light sensitive element and b) avoid saturation when the input signals from the light sensitive element are large. These two criteria are mutually exclusive in conventional solid-state image sensor structures. However, the present invention realizes that the two criteria can be satisfied through the use of a phase domain integrator image sensor structure such as that of FIG. 9.

The operation of the phase domain integrator can best be fully understood by exploring the concepts of integration, phase and frequency and their interrelation. The integration function, or integral, is a mathematical function that is well known in the art. Briefly, an integral is a mathematical object that can be interpreted as an area or a generalization of area. If a signal is plotted as a curve, the integral of the signal is the area under the curve. An integrator is a device that integrates a signal present at its input and produces an integrated version of the input signal at its output.

Phase and frequency have a differential relationship. The total phase traversed by an oscillator output $V_{out}$ during a duration of time $\Delta T$ is mathematically given by $$\Delta\theta = \int f_{inst} dt = \int (f_{nom} + f_{gain} \cdot S_{in}) dt$$

where the integral limits are over the time duration $\Delta T$.

Separating the integral terms $$\Delta\theta = \int (f_{nom} + f_{gain} \cdot S_{in}) dt = \int f_{nom} dt + \int f_{gain} \cdot S_{in} dt = K + f_{gain} \cdot \int S_{in} dt$$

where the term K is a constant that is a function of the constant value $f_{nom}$ and $\Delta T$ (the integration time) and is therefore well known.

For the special case where $f_{nom}=0$ then $K=0$ and $$\Delta\theta = f_{gain} \cdot \int S_{in} dt.$$

The second term consists of a constant value multiplier $f_{gain}$ and the term $\int S_{in} dt$ which is the integral of the input signal $S_{in}$. The term $f_{gain} \cdot \int S_{in} dt$ can be easily obtained by subtracting the value of K from the $\Delta\theta$ value at the end of the time period $\Delta T$:

$$f_{gain} \cdot \int S_{in} dt = \Delta\theta - K \text{ and}$$

$$\int S_{in} dt = (\Delta\theta - K)/f_{gain}$$

For the special case $f_{nom}=0$ and therefore $K=0$ $$\int S_{in} dt = \Delta\theta/f_{gain}$$

Figure 10A:
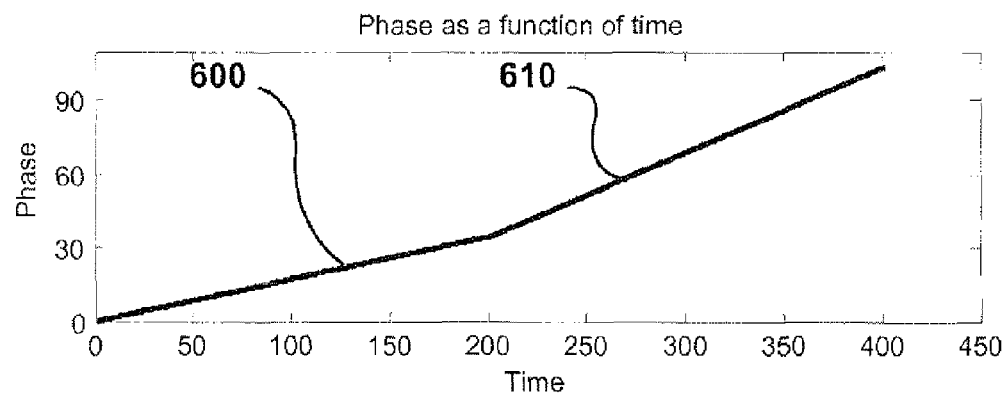
FIGS. 10A and 10B are graphs illustrating an oscillator phase (9A) and a integrator output signal (9B), and is used to describe the signal integration capabilities of the present invention.
Figure 10B:
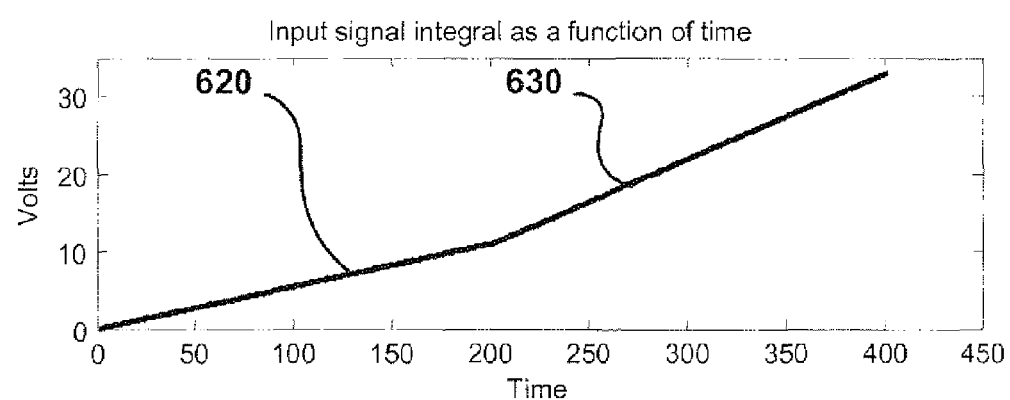

The relationship above establishes the differential relationship between the VCO control input signal $S_{in}$ and the phase $\Delta\theta$ traversed by the VCO or oscillator output during a period of time $\Delta T$. FIGS. 10A and 10B illustrate this equivalence graphically. FIG. 10A plots the phases traversed by the VCO output as a function of time. FIG. 10B plots the integral with respect to time of the input control signal $S_{IN}$.

FIG. 11A illustrates a voltage controlled oscillator output waveform generated in response to an input signal SIN illustrated in FIG. 11B. $S_{IN}$ is comprised of two constant value segments, the first segments labeled 720 in FIG. 11B being lower in value than the second segments, labeled 730 in FIG. 11B.

Referring back to FIG. 10B, integrator output segment 620 is the integral output as a function of time of $S_{IN}$ when the lower value $S_{IN}$ segment 720 was input to the integrator. Integrator output segment 630 is the integral output as a function of time of $S_{IN}$ when the higher value $S_{IN}$ segment 730 was input to the integrator.

The lower value $S_{IN}$ segment 720 caused the VCO to oscillate at a lower frequency than the higher value $S_{IN}$ segment 730. Waveform segment 700 in FIG. 11A illustrates the lower VCO oscillation frequency. The higher value $S_{IN}$ segment 730 at the VCO input causes the VCO to oscillate at a higher frequency than the lower value $S_{IN}$ segment. Waveform segment 710 in FIG. 11A illustrates the higher VCO oscillation frequency.

FIG. 10A plots the phases traversed by the VCO as a function of time. Segment 600 corresponds to VCO output segment 700. Segment 610 corresponds to VCO output segment 710. Segment 600 indicates a lower phase accumulation rate than segment 610. The phase accumulation rate is the phase traversed by the VCO as a function of time and can be expressed in units of radians per second. This is identical to the velocity with which the VCO traverses a unit of phase is the frequency of oscillation that is expressed in units of radians per second.

The VCO control signal input waveform segment 720 causes the VCO to output waveform segment 700. The plot of the VCO output phase as a function of time generates the curve segment 600. The VCO control signal input waveform segment 730 causes the VCO to output waveform segment 710. The plot of the VCO output phase as a function of time generates the curve segment 610. The waveforms plotted in FIGS. 10a and 10b are identical in shape and are related by the constant $f_{gain}$ when $f_{nom}=0$ and therefore K=0; when $f_{nom} \neq 0$ and therefore K≠0 the waveforms plotted in FIGS. 10A and 10B are related by the constants $f_{gain}$ and K.

Accordingly it is realized that the time domain integral of the input signal $S_{IN}$ is therefore functionally equivalent to the phase domain integral of the input signal $S_{IN}$. The time domain integral of the input signal $S_{IN}$ and the phase domain integral of the input signal $S_{IN}$ are related through two constants, one of which equals zero for the special case $f_{nom}=0$.

The use of the method disclosed herein to perform signal integration has advantages over conventional integrators and resolves difficult performance issues associated with conventional integrators. One advantage is the resolution of the potential to saturate the integrator output. VCO or oscillator outputs are strictly bound by upper and lower limits (peak values) which are not exceeded under any circumstances. Therefore output saturation conditions cannot occur.

Figure 12:
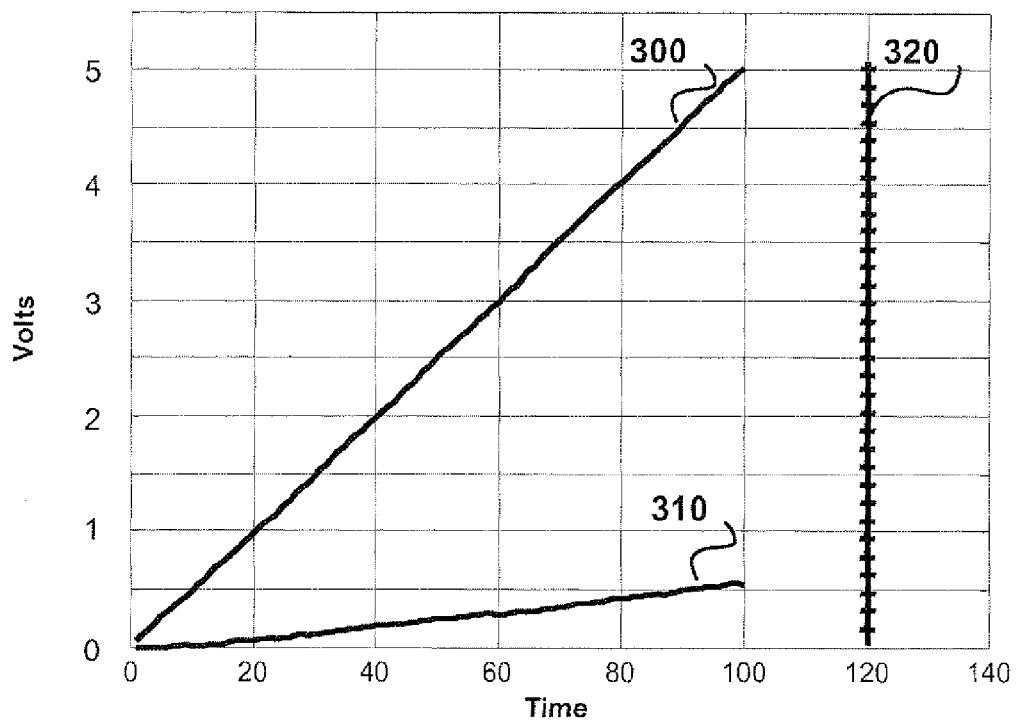
FIG. 12 is a graph illustrating the affects of quantization error on low intensity signals.

Another advantage is the resolution of the issue of quantization noise. As illustrated in FIG. 12 low level signal 310 could suffer from significant and unacceptable quantization noise, with little distinction between output voltages caused by small variations in input intensities. Phase measurement based integration measures the phase traversed by the oscillator output $\Delta\theta$ during integration time $\Delta T$. The phase traversed by the oscillator output $\Delta\theta$ during integration time $\Delta T$ is proportional to the integral of the input control signal during integration time $\Delta T$ and the two are proportional. The minimum $\Delta\theta$ value occurs for the smallest integral output. But $$f_{gain} \cdot \int S_{in} dt = \Delta\theta - K$$

where K is a constant. Therefore the term $\Delta\theta-K$ can be independently set to a specific value for any given value of $\int S_{in} dt$, including its minimum, by simply adjusting the VCO gain $f_{gain}$. The ability to set the gain of the integrator and hence the minimum value of the measured integrator output variable eliminates the quantization noise issue associated with conventional integrators.

Yet another advantage is that variable oscillator circuits are common and fundamental building blocks of a wide variety of systems. Therefore they are widely available and have been highly optimized.

Thus VCO-based integrators are far superior to conventional integrators in quantization noise and dynamic range or lack of output saturation. Other advantages exist and are apparent to one versed in the art.

Oscillators are a class of circuits well known in the art. The output of oscillator circuits can have a variety of shapes but they are all periodic, meaning that the output waveform is repetitive. One repetition of the output waveform comprises one oscillation cycle and the duration of a cycle is defined as its period of oscillation.

The frequency of oscillation, $f_{osc}$, is defined as the number of periods of oscillation per unit time and it is usually measured in Hertz (periods of oscillation per second). By convention the angular frequency of an oscillator is defined as $\omega=2\pi f_{osc}$ and one complete cycle of oscillation traverses a phase angle $\theta$ of $2\pi$ radians.

Associated with an oscillator are initial conditions, that is the state of the system at some arbitrary time, t=0. An example of an initial condition might be the initial phase of the oscillator at t=0 measured in radians.

Figure 13A:
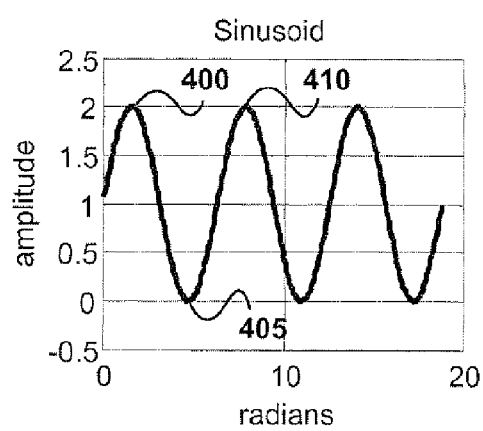
Figure 13B:
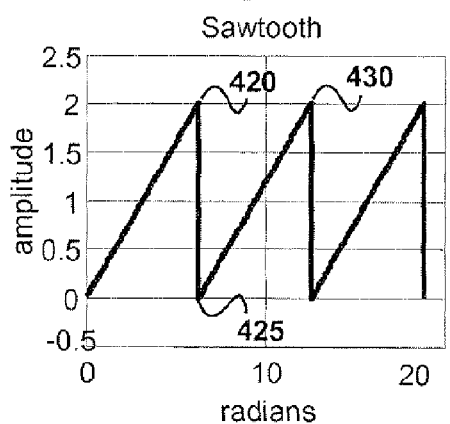
Figure 13D:
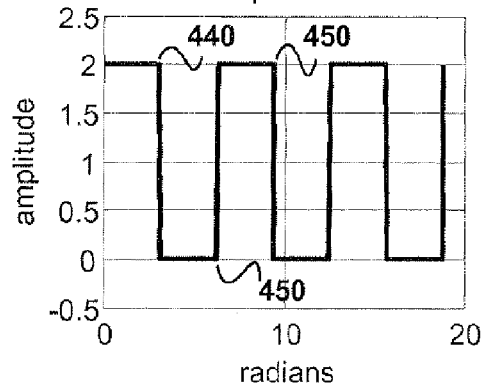

FIGS. 13A, B, C and D illustrate common output waveforms of oscillator circuits. As well known in the art FIGS. 13 A, B, C and D illustrate the output waveform of sinusoidal, triangular, sawtooth and square wave oscillators. In all cases the peak voltage range shown is two volts. FIGS. 13A-13D represent output waveforms from one embodiment of an 'asynchronous' VCO oscillator circuit. In such a circuit, the oscillator outputs are obtained via continuous sampling of the electrical signals generated by the impinging radiation, resulting in virtual instantaneous (or asynchronous) switching of the VCO waveform when the impinging voltage reaches a predetermined threshold. Thus it can be seen that the peak and minimum voltages in FIGS. 13A-13D are relatively constant throughout each capture.

FIGS. 13E-13H illustrate exemplary output waveforms of one embodiment of a synchronous VCO oscillator circuit which may be used in the present invention. As will be described in more detail below, a synchronous VCO circuit samples electric signal at discrete clocked intervals. Switching of the VCO waveforms thus occurs only upon the culmination of two events; a clock cycle in which the voltage associated with the impinging radiation exceeds a predetermined threshold (either positively, or negatively). As a result, the peak and minimum voltages of the waveforms of FIG. 13E-13H may vary for each VCO period, in accordance with the intensity of the impinging radiation. For example, in FIG. 13E, the response is a straight line because the light intensity received at that pixel was sufficiently low that by the end of the exposure period, that the capacitor output did not reach the maximum threshold level (that part of the image might have been the shadow segment).

The frequency of oscillation of any electronic oscillator circuits can be fixed or variable. A common oscillator with variable frequency of oscillation is the voltage-controlled oscillator (VCO). At a minimum a VCO has a voltage input at which a signal voltage $S_{in}$ controls the frequency of oscillation. Voltage relates to current through Ohm's law and a signal $S_{in}$ can be said to control the frequency of oscillation through its current rather than voltage characteristic.

A VCO may also have a nominal frequency of oscillation $f_{nom}$. The VCO oscillates at $f_{nom}$ when the frequency control input $S_{in}$ level is not present or of a value that does not modify the frequency of oscillation, such as for example zero volts. The nominal frequency of oscillation can have any specified value including zero Hertz.

The output frequency of the VCO changes in response to amplitude variations of the input signal. Thus the instantaneous frequency of oscillation of the VCO will differ from the nominal frequency of oscillation of the VCO by some value $f_{delta}$ and will be given by $$f_{inst} = f_{nom} + f_{delta}$$

where $$f_{delta} = f_{gain} \cdot S_{in}$$

In this example the term $f_{delta}$ is measured in radians per second, $f_{gain}$ is measured in radians per second per volt and $S_{in}$ is measured in volts.

As described above, FIG. 11A illustrates the input and output signals of a VCO. The frequency of oscillation of the VCO output changes in response to variations in the input signal amplitude. The VCO output segment 700 corresponds to input signal segment 720. The VCO output segment 710 corresponds to input signal segment 730. The frequency of oscillation of VCO output segment 700 is lower than the frequency of oscillation of VCO output segment 710. The amplitude of input signal segment 720 is lower than the amplitude of input signal segment 730. Therefore $f_{gain}$ has a positive value and the VCO frequency of oscillation is directly proportional to the input control signal amplitude.

A VCO may also have additional inputs, such as RESET/ENABLE. The function of RESET/ENABLE when in the RESET state is to reset the VCO output waveform to a predetermined voltage that can be any value within the peak-to-peak voltage range. The function of RESET/ENABLE when in the ENABLE state is to enable the VCO output to oscillate.

A VCO has an output $V_{out}$. During each period of oscillation $V_{out}$ traverses an angular phase of $2\pi$ radians. This implies that the output phase is measurable modulo $2\pi$ and oscillator output values at phases that are separated by exactly $2\pi$ are identical. As mentioned above, FIGS. 13A-13H illustrate several common VCO output waveforms. During a complete period each waveform in FIGS. 13A-13D and 13F-13H traverses exactly $2\pi$ radians and waveforms values at phases that are separated by exactly $2\pi$ are identical for all waveforms The phase traversed by the oscillator output during a subset of one period is determined, in one embodiment, by sampling the oscillator output at the two instances of time marking the beginning and end of the subset of one period, identifying the phase associated with each sample and subtracting the two phases.

The phase traversed by the oscillator output during a duration of time that spans more than one period of oscillation can only be determined modulo $2\pi$ radians when using a method based on direct observation of the VCO output at two time instances. Thus an additional function is used that counts the number of periods or significant fractions of a period traversed by the VCO output in order to resolve the ambiguity.

A circuit that counts the number of periods or significant fractions of a period traversed by the VCO output in a time interval, or 'unwraps' the phase, can be readily implemented. Waveforms associated with such a circuit are illustrated in FIGS. 14A and 14B. The VCO output in FIG. 14A is the triangular VCO output waveform. At times t=0, 0.5 $T_P$ and $T_P$ the VCO output waveform reaches states labeled 900, 910 and 920 corresponding to a travel of 0, $\pi$ and $2\pi$ radians.

The output of the phase unwrapping circuit changes states at times t=0, 0.5 $T_P$ and $T_P$ to levels of 0, V and 2V amplitude. The transition times are labeled 930, 940 and 950 and they correspond to the VCO output states labeled 900, 910 and 920, respectively.

The relationshSYSTEM AND ip between the VCO output and the output of the phase unwrapping circuit, illustrated over one period of the VCO output, can be extended over any number of VCO output periods with the output of the phase unwrapping circuit increasing in value by a predetermined amount each time the VCO output goes through its 0 and $\pi$ (modulo $2\pi$) phase values. It is known to one skilled in the art that there are alternative ways to implement the phase unwrapping function and mark the value of the unwrapped phase traversed by the VCO output.

The total phase traversed by the VCO output is given by the summation of two terms. The first term is the total unwrapped phase recorded by the phase unwrapping circuit. The second term is the total phase traversed by the VCO output since the last update of the phase unwrapping circuit output. This quantity can be unambiguously obtained by direct measurement of the VCO output.

Figure 15A:
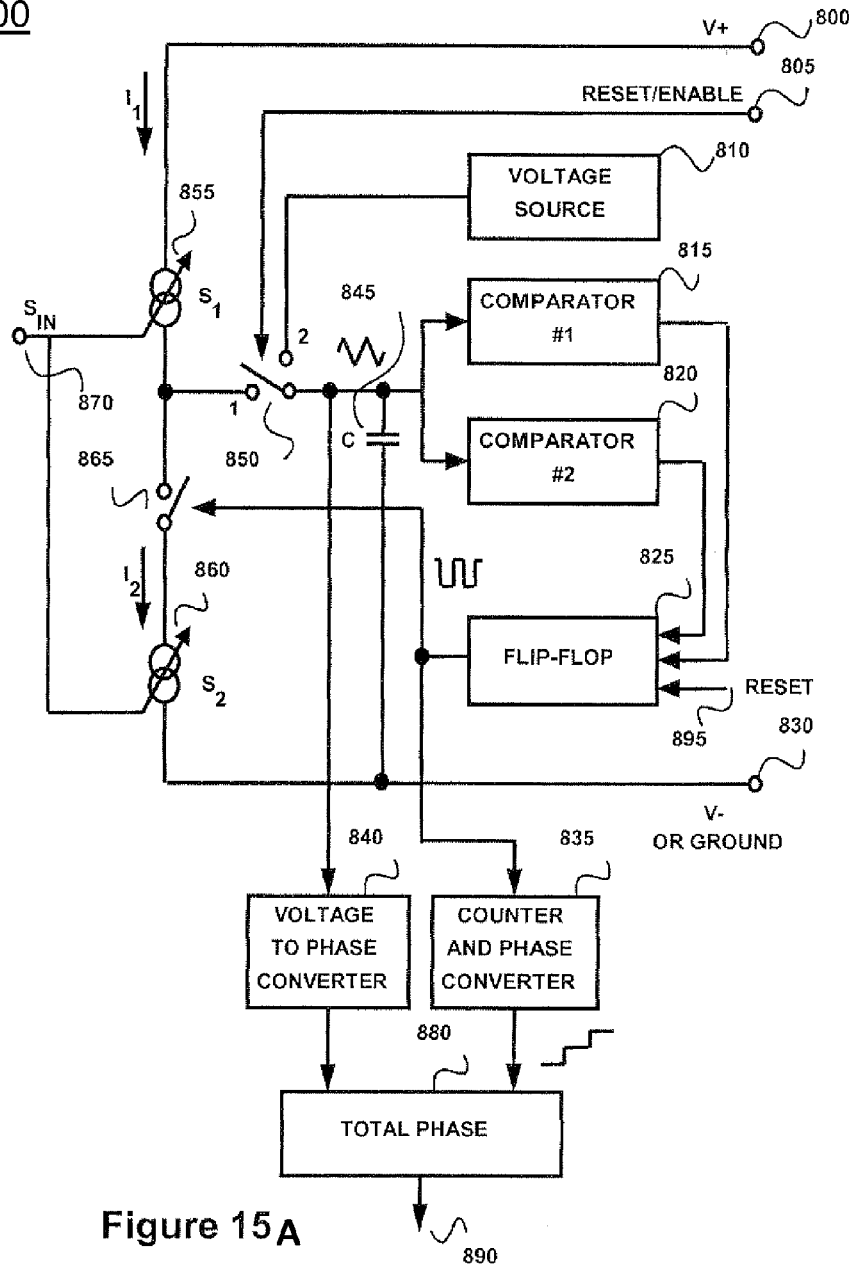
FIG. 15A is an exemplary block diagram of a sensor element 1500 of the present invention including a phase domain integrator for integrating phase information obtained via continuous sampling of impinging radiation on the sensor element to provide an output voltage corresponding to the impinging radiation.

FIG. 15A incorporates a simplified block diagram of the VCO subset of ICL8038 a commercially available IC. For the purposes of this specification, the embodiment of FIG. 15A is an asynchronous image sensor 1500, which continuously samples the VCO output; i.e., the voltage values that are generated in response to the impinging electromagnetic radiation and that are continuously monitored and compared against threshold values by comparators to determine when the voltage values have met the maximum and minimum threshold voltages of the VOC waveform and thereby control the shape of the waveform. Additional phase unwrapping, total phase traversed and VCO RESET/ENABLE functions are added.

Figure 15B:
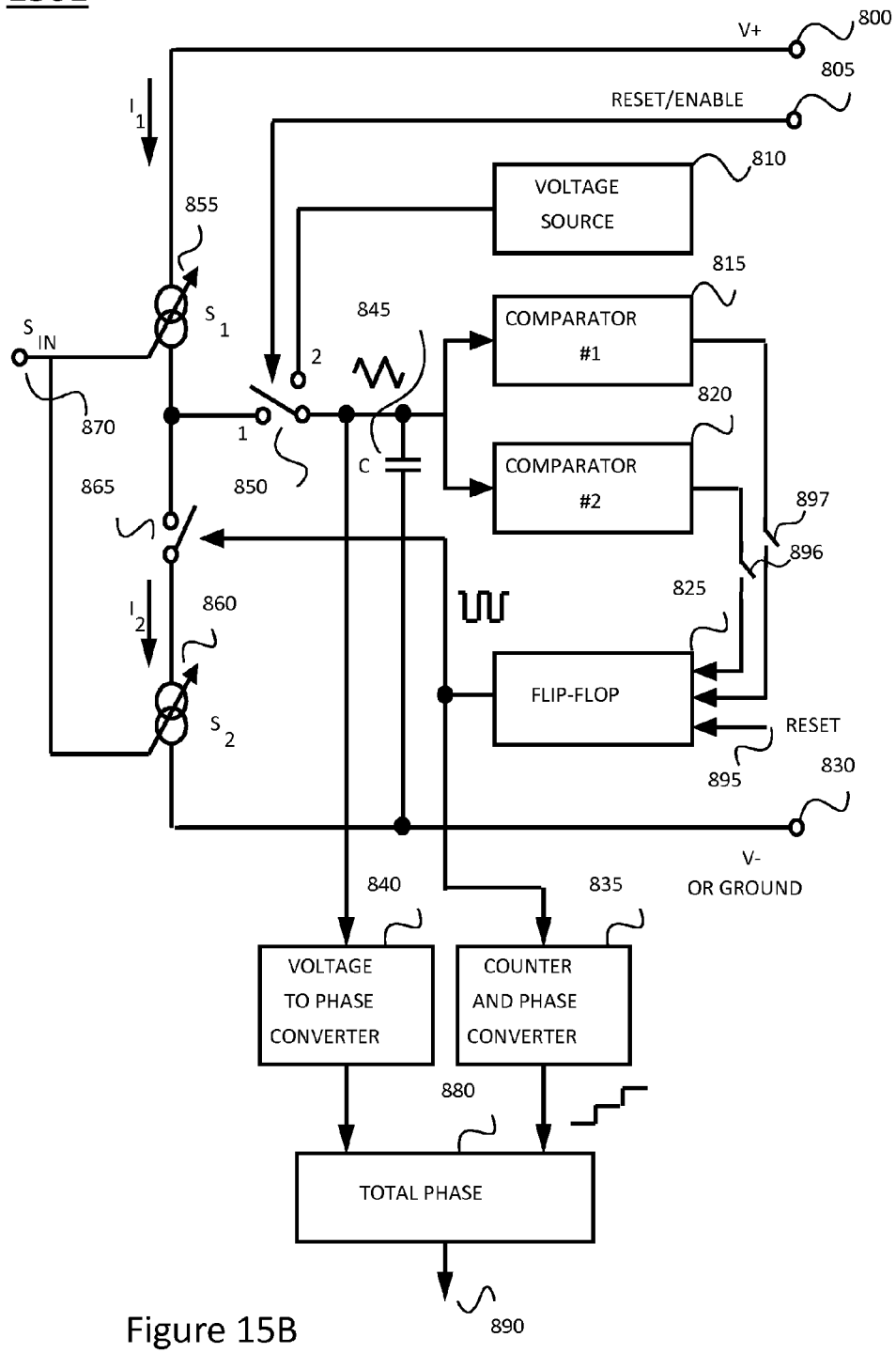
FIG. 15B is a second exemplary block diagram of a sensor element 1501 of the present invention including a phase domain integrator for integrating phase information obtained via periodic sampling of impinging radiation on the sensor element to provide an output voltage corresponding to the impinging radiation.

A second embodiment, described with regard to FIG. 15B, is referred to as a synchronous image sensor 1501, which samples the VCO output only at discrete time intervals.

Current sources 860 and 855 charge and discharge, respectively, capacitor 845. The charging and discharging of capacitor 845 is determined by switch 865 which is controlled by flip-flop 825 and which connects current source 860 or 855 to capacitor 845.

Flip-flop 825 changes states when triggered by comparators 815 and 820. Comparator 815 is triggered when capacitor 845 reaches a predetermined high voltage. Comparator 820 is triggered when capacitor 845 reaches a predetermined low voltage.

The predetermined high voltages and low voltages are a matter of design choice. Generally speaking the predetermined high and low voltages are selected based on the capabilities of capacitor 845. In some embodiments, the high and low voltages may be selected so that they are symmetrically distributed around the median voltage of the capacitor, although this is not a requirement. In alternate embodiments, for example, the high and low voltage thresholds may be selected so that they are asymmetrically distributed within the potential capacitor voltage. For example, a maximum predetermined threshold voltage may be equal to half the maximum capacitor voltage, while the minimum predetermined threshold voltage may be equal to the maximum predetermined threshold voltage minus one half the maximum capacitor voltage value. Selecting a maximum threshold that is below the maximum capacitor voltage reduces the potential for capacitor saturation during the capture of high intensity image segments.

When comparator 815 is triggered flip-flop 825 changes state such as to cause switch 865 to close. Current $I_2$ of current source 860 causes capacitor 845 to discharge thus causing the voltage across capacitor 845 to decrease. The decrease of the voltage across capacitor 845 immediately causes comparator 815 to change state.

When the voltage across capacitor 845 decreases to a sufficiently low value comparator 820 is triggered. When comparator 820 is triggered flip-flop 825 changes state such as to cause switch 865 to open. Current $I_1$ of current source 855 causes capacitor 845 to charge thus causing the voltage across capacitor 845 to increase. The increase of the voltage across capacitor 845 immediately causes comparator 820 to change state.

When the voltage across capacitor 845 increases to a sufficiently high value comparator 815 is again triggered causing flip-flop 825 to change state and capacitor 845 charge/discharge cycle to repeat.

The relationship between the charge held by capacitor 845 and the voltage across capacitor 845 is Q=C·V where C is the capacitance of capacitor 845 measured in Farads, Q is the charge held by capacitor 845 measured in Coulombs and V is the voltage across capacitor 845 measured in Volts.

The change in charge held by capacitor 845 due to a constant current I that flows for an interval of time ΔT is given by ΔQ=I·ΔT where ΔQ is the change in charge held by capacitor 845 in Coulombs, I is the value of the current in Amperes and ΔT is the interval of time of current flow in seconds. A constant current causes a linear change in the charge held by capacitor 845 as a function of time. The linear change in the charge held by capacitor 845 as a function of time causes a linear change in voltage across capacitor 845 as a function of time.

Figure 13C:
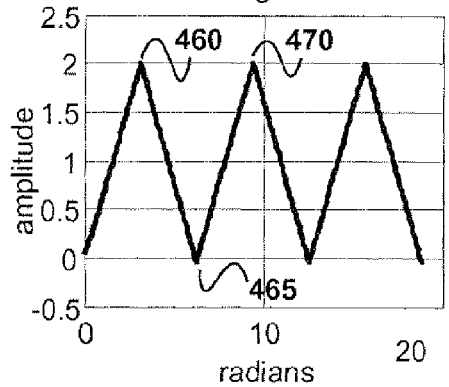

The constant value of currents $I_1$ and $I_2$ generated by current sources 855 and 866 cause the voltage across capacitor 845 to increase and decrease linearly generating a triangular waveform. If the net effects of currents $I_1$ and $I_2$ are equal the rising and falling segments of the triangular voltage waveform across capacitor 845 are symmetric as illustrated in FIG. 13c. If the net effects of currents $I_1$ and $I_2$ are not equal the rising and falling segments of the triangular voltage waveform across capacitor 845 are not asymmetric. In the limit as the net effects of current $I_1$<<the net effects of current $I_2$ the triangular voltage waveform across capacitor 845 tends to the sawtooth waveform illustrated in FIG. 13b.

The time to charge and discharge capacitor 845 is determined by the magnitude of currents $I_1$ and $I_2$ generated by current sources 860 and 855. The sum of the times required to charge and discharge capacitor 845 to voltage levels that trigger comparators 815 and 820 determine the period of oscillation of the VCO. Therefore the magnitudes of currents $I_1$ and $I_2$ determine the period and frequency of oscillation of the VCO.

The control signal applied at input 870 controls current sources 860 and 855 and therefore controls the VCO frequency of oscillation. Although not shown a simple voltage or current splitter as well known to one versed in the art can be added between the control signal applied at 870 and current sources 860 and 855 to adjust the waveform symmetry.

Reversal of the voltage across capacitor 845 is controlled by the state of flip-flop 825. Counter 835 is triggered and modifies its output state correspondingly each time flip-flop 825 changes state. The change in counter 835 output state can be a modified voltage level as shown in FIG. 14b. Other voltage level modification schemes can be used as long as separate states are resolvable. Counter 835 output can also be of a digital format consisting of a digital word containing B bits. In such case a change in its output state can be a binary number where different states differ in one or more bits.

The output state of counter 835 changes each time flip-flop 825 changes states and therefore counts how many times the VCO output reached its minimum and maximum values. If the output state of counter 835 is an even number the output of the VCO traversed an integer multiple of $2\pi$ radians. The number of $2\pi$ radians traversed by the VCO output is then given by dividing the output count of counter 835 by two.

If the output state of counter 835 is an odd number the number of $2\pi$ radians traversed by the output of the VCO has an integer and a fractional part. The integer part of the number of $2\pi$ radians traversed by the output of the VCO is given by dividing by two a number obtained by subtracting one from the output state of counter 835. The fractional part of the number of $2\pi$ radians traversed by the output of the VCO depends on the degree of asymmetry between the rising and falling segments of the waveform and can be readily obtained by one skilled in the art. By way of example if the rising segment of the waveform takes twice as long as the falling segment of the waveform than then it requires ⅔ of a period of oscillation to complete.

The voltage across capacitor 845 is proportional to the phase traversed by the VCO output following the last change in state of flip-flop 825. It can be readily obtained by one skilled in the art if a) the trigger voltages of comparators 815 and 820 (i.e., the maximum and minimum voltages of the VCO output) and b) the asymmetry between the rising and falling segments of the VCO output waveform are known. By way of example consider that if a) the VCO output voltage is halfway between the minimum and maximum value on the rising segment of the waveform and b) the rising segment of the waveform takes twice as long as the falling segment of the waveform then the waveform measurement is at ⅓ of a period of oscillation.

The total phase traversed by the output of the VCO is obtained by summing the phase traversed by the VCO output as recorded by the voltage to phase converter 840 and by counter and phase converter 835. This function is performed by summer 880 and made available at output 890.

Switch 850 resets capacitor 845 and therefore the VCO oscillator output to an initial voltage output by voltage source 810. Flip-flop 825 is reset by signal 895. The initial voltage of voltage source 810 together with the reset state of flip-flop 825 and the degree of asymmetry between the rising and falling segments of the VCO output waveform are sufficient to determine the initial phase of the VCO output waveform. This derivation is well known to one versed in the art.

Continuous sampling of the electrical signals generated by the impinging electromagnetic radiation provides a waveform which switches asynchronously, i.e., based only on the triggering of a maximum or minimum threshold voltage. With such continuous sampling, and appropriate selection of maximum thresholds and minimum thresholds within the capacitor range, there is little chance of saturation of the capacitor and concomitant loss of dynamic range.

Discrete sampling provides an output waveform which switches synchronously; i.e., in response to the combination of the maximum or minimum threshold value as well as the transition of a clocking signal. For high level signals, there is the potential for saturation of the capacitor should the maximum voltage of the capacitor be exceeded prior to the next clock cycle. If the capacitor saturates, the shape of the VCO waveform is compromised and the ability to accurately capture high intensity image segments may be degraded. Thus it is important that both the maximum and minimum comparator thresholds and the clock sampling frequency be selected to ensure that accurate phase information be obtained for all intensity signals. In one exemplary embodiment, the maximum threshold is set to be equal to one half the maximum voltage of the capacitor, the minimum threshold is set to be equal to the maximum threshold minus one half of the maximum voltage of the capacitor, and the clock frequency is set to 125 microseconds. It is appreciated, however, that the selection of maximum and minimum thresholds and the clock frequencies are a matter of design choice, and any combination of thresholds and discrete sampling frequencies that permit capture of a full dynamic range of signal intensities for a given application are considered to be within the scope of the present invention.

FIG. 15B illustrates an alternate embodiment of a VCO which periodically samples the electrical signals associated with impinging radiation using switches 896 and 897 to synchronously capture the output of comparators 815 and 820. The switches are driven by a clock signal (not shown). When the switches 896, 897 are open the flip flop 825 remains in its last state (for example the voltage across capacitor 845 increasing). When the switches are closed there are two possibilities (assume that the capacitor increases in voltage in response to the impinging electromagnetic radiation immediately prior to closing switches 896 and 897). Either the capacitor is below the predetermined high voltage (maximum threshold), [in which case nothing happens and the capacitor voltage continues to increase] or the capacitor voltage is at or above the predetermined high voltage.

If the capacitor output voltage is at or above the maximum threshold when the switches are closed during a clock cycle, then flip-flop 825 will change state when triggered by comparators 815 and 820 such as to cause switch 865 to close. Current $I_2$ of current source 860 causes capacitor 845 to discharge thus causing the voltage across capacitor 845 to decrease. The capacitor voltage may be pulled fully to ground, or may alternatively be discharged by a predetermined amount, less than ground. The decrease of the voltage across capacitor 845 immediately causes comparator 815 to change state When the voltage across capacitor 845 decreases to a sufficiently low value comparator 820 is triggered. At the next clock cycle immediately succeeding the triggering of comparator 820, flip-flop 825 changes state such as to cause switch 865 to open. Current $I_1$ of current source 855 causes capacitor 845 to charge thus causing the voltage across capacitor 845 to increase. The increase of the voltage across capacitor 845 immediately causes comparator 820 to change state.

As well known in the art and described in the ICL8038 application notes literature sinusoidal, square and sawtooth waveforms are derived by additional internal circuits using the basic triangular waveform discussed herein. Therefore the items addressed herein apply equally to other VCO output waveform shapes. Two embodiments of a phase domain integration image sensor have been shown and described, each having their own advantages. The selection of a continuously sampling, asynchronous image sensor versus a periodic sampling, synchronous image sensor is a matter of design choice.

The present invention thus replaces the conventional integrator component of a pixel structure with a high gain and high dynamic range integrator that performs the time integration of the input signal in the phase domain in either an asynchronous or synchronous fashion.

Figure 16:
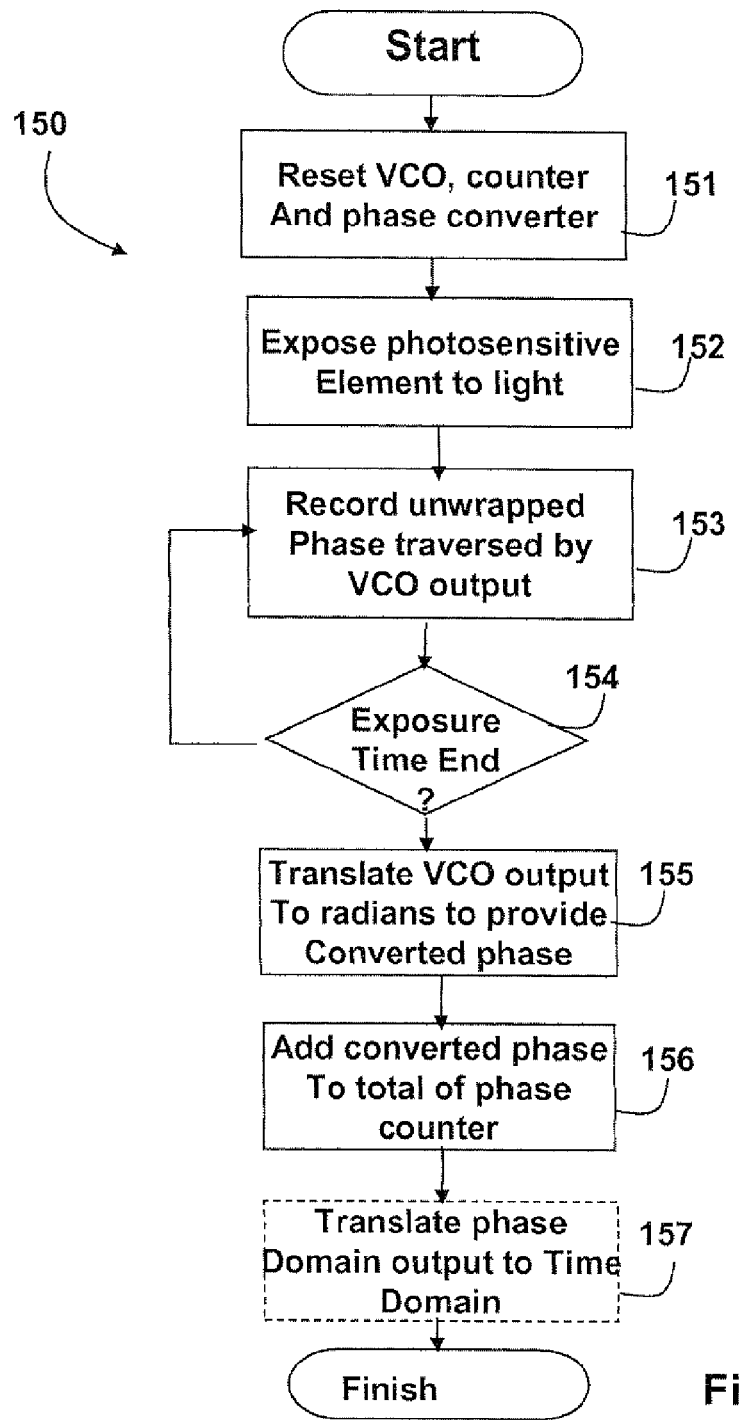
FIG. 16 is a flow diagram provided to illustrate several steps that may be performed during an image capture process by the phase domain integrator of FIG. 15.

FIG. 16 is a flow diagram which illustrates several exemplary steps that may be performed during a capture process 150 by a pixel structure that uses the phase domain integrator of the present invention.

At the beginning of said exposure time (step 151), the VCO output and the counter and phase converter 835 are reset. At step 152 the photosensitive element is exposed to light and changes its electrical characteristics causing the VCO output to change frequency. The photosensitive element can be any element such as a photodiode, a photogate, a phototransistor or a photoresistor. The present invention is also related to a solid-state imaging device, such as a CMOS or MOS imaging device having a geometric configuration of pixels, at least part of the pixels having the structure described above.

At step 153 counter and phase converter 835 records the unwrapped phase traversed by the VCO output. When it is determined at step 154 that the exposure frame ends the output of the VCO is translated to radians by voltage to phase converter 840 at step 155. The outputs of the counter and phase converter 835 and voltage to phase converter 840 are added by total phase adder 880. At step 156 the phase domain integration result may be translated to the time domain integration result if so desired. Step 157 is shown in dashed lines to indicate that it is not a necessary step of the capture process.

According a method and apparatus has been described for obtaining a read-out signal of a solid-state pixel structure (including CCD, CMOS- and MOS-based pixel structures). The pixel structure includes at least a photosensitive element with an output node, means to integrate the output node signal in the phase domain and means to read the phase domain integration value. With such an arrangement a solid-state pixel is provided that is capable of producing a faithful reproduction of an image to be captured regardless of the intensity of electromagnetic energy impinging on the sensor.

Having described various embodiments of the invention, it will be appreciate that although certain components and process steps have been described the descriptions are representative only; other functional delineations or additional steps and components can be added by one of skill in the art, and thus the present invention should not be limited to the specific embodiments disclosed. The various representational elements may be implemented in hardware, software running on a computer, or a combination thereof and modification to and variation of the illustrated embodiments may be made without departing from the inventive concepts herein disclosed. Accordingly, the invention should not be viewed as limited except by the scope and spirit of the appended claims.

The invention claimed is:

1. A method for obtaining a high dynamic range read-out signal from a pixel structure includes the steps of:
   generating an integrated value of a response of a photosensitive element to impinging electromagnetic radiation using phase information obtained via periodic sampling of the response.

2. The method of claim 1 wherein the phase information is provided by an oscillator operating in a synchronous mode and coupled to receive the response of the photosensitive element and to provide an output waveform that varies in frequency in accordance with the response.

3. The method of claim 2 wherein the oscillator is one of a voltage or current controlled oscillator.

4. The method of claim 1 including the step of periodic sampling of the response, the step of periodic sampling of the response including the step of comparing a value of a signal associated with the response against a predetermined threshold to determine whether the value exceeds the threshold.

5. The method of claim 4 wherein the step of comparing occurs at periodic intervals.

6. A pixel structure including:
   a photosensitive element for generating a signal in response to electromagnetic radiation; and
   a synchronous phase integrator, coupled to the photosensitive element, for integrating the response of the photosensitive element to the electromagnetic radiation over an exposure time period using phase information obtained via periodic sampling of the response.

7. The pixel structure of claim 6 wherein the phase integrator further includes an oscillator coupled to provide an output waveform in response to a value of the signal from the photosensitive element.

8. The pixel structure of claim 6 wherein the phase integrator includes logic for accumulating a traversed phase of the output waveform during an integration period.

9. The pixel structure of claim 8, wherein the logic for accumulating a traversed phase includes the logic for identifying a difference in phase of the output waveform between a start and an end of the integration period.

10. The pixel structure according to claim 8, wherein the logic for accumulating includes an accumulator for accumulating a sum of periods of the output waveform provided by the oscillator.

11. The pixel structure of claim 7 wherein an output of the oscillator varies in frequency in accordance with an intensity of the input signal.

12. The pixel structure of claim 7 wherein the oscillator is a voltage controlled oscillator.

13. The pixel structure of claim 7 wherein the oscillator is a current controlled oscillator.

14. The pixel structure of claim 6 adapted to produce a large output in response to weak input signals from the light sensitive element 15. The pixel structure of claim 6 adapted to avoid saturation when the signals from the photosensitive element are large.

16. A method of capturing an image includes the steps of:
exposing a photosensitive element to electromagnetic radiation to generate a sensor signal for an exposure period; and
providing a pixel having a synchronous oscillator and adapted to accumulates traversed phases of an output waveform of the pixel oscillator during the exposure period to provide an integrated result, the oscillator waveform produced by the pixel oscillator in response to the sensor signal.

\* \* \* \* \*